United States Patent
Kim et al.

(10) Patent No.: US 11,971,437 B2
(45) Date of Patent: Apr. 30, 2024

(54) GRID VOLTAGE PHASE DETECTOR

(71) Applicant: HYOSUNG HEAVY INDUSTRIES CORPORATION, Seoul (KR)

(72) Inventors: Hyun Jun Kim, Incheon (KR); Hae Won Seo, Seoul (KR); Byung Hwan Jeong, Gwacheon-si (KR)

(73) Assignee: HYOSUNG HEAVY INDUSTRIES CORPORATION, Seoul (KR)

( * ) Notice: Subject to any disclaimer, the term of this patent is extended or adjusted under 35 U.S.C. 154(b) by 288 days.

(21) Appl. No.: 17/611,843

(22) PCT Filed: May 25, 2020

(86) PCT No.: PCT/KR2020/006762
§ 371 (c)(1),
(2) Date: Nov. 16, 2021

(87) PCT Pub. No.: WO2020/242163
PCT Pub. Date: Dec. 3, 2020

(65) Prior Publication Data
US 2022/0214386 A1    Jul. 7, 2022

(30) Foreign Application Priority Data
May 28, 2019  (KR) .......................... 10-2019-0062476

(51) Int. Cl.
*G01R 25/00*       (2006.01)
*H02J 3/40*        (2006.01)
*H03L 7/085*       (2006.01)

(52) U.S. Cl.
CPC .............. *G01R 25/00* (2013.01); *H02J 3/40* (2013.01); *H03L 7/085* (2013.01)

(58) Field of Classification Search
CPC ........ G01R 25/00; G01R 19/10; G01R 19/25; G01R 19/252; G01R 19/2513; H02J 3/40;
(Continued)

(56) References Cited

U.S. PATENT DOCUMENTS

2006/0215064 A1*  9/2006  Dawson .................. H03L 7/091
                                                                    348/730
2021/0083679 A1*  3/2021  Yang ......................... H03L 7/07

FOREIGN PATENT DOCUMENTS

JP        2012-252443 A   12/2012
KR    10-2009-0067570 A    6/2009
(Continued)

*Primary Examiner* — Son T Le
(74) *Attorney, Agent, or Firm* — NKL Law; Jae Youn Kim

(57) ABSTRACT

A grid voltage phase detector includes: a d-q transformation unit for receiving a three-phase signal and producing a signal on d axis and a signal on q axis; a phase signal producing unit for producing a signal for phase synchronization of grid voltage from the signal on d axis and the signal on q axis; and a PR filtering unit, with a first filter having no change in magnitude and phase at a rated frequency, a second filter introducing 90° phase lead at a rated frequency, a third filter introducing 90° phase lag, and a fourth filter having no change in magnitude and phase at a rated frequency, for removing unbalanced components and harmonic components from the signal on d axis and the signal on q axis produced by the d-q transformation unit and providing the signals to the phase signal producing unit.

5 Claims, 13 Drawing Sheets

(58) Field of Classification Search
CPC . H03L 7/07; H03L 7/081; H03L 7/091; H03L 7/093; H03L 7/085
See application file for complete search history.

(56) References Cited

FOREIGN PATENT DOCUMENTS

| KR | 10-2014-0110595 A | 9/2014 |
| KR | 10-1781817 B1 | 9/2017 |
| KR | 10-2018-0057419 A | 5/2018 |

* cited by examiner

GRID VOLTAGE PHASE DETECTOR

FIELD OF THE INVENTION

The present invention relates to a grid voltage phase detector, and more particularly to, the grid voltage phase detector capable of accurately detecting grid power voltage and phase even in a poor environment such as voltage dips, harmonics or phase-angle jumps in a phase-locked loop circuit for a reference phase of a three-phase voltage signal.

BACKGROUND OF THE INVENTION

Recently to reduce fossil energy consumption, the use of renewable energy sources such as sun, wind and hydrogen is rapidly increasing. Accordingly, a grid-connected inverter, which is connected between such energy sources and the power grid, controls grid power in order to supply active and inactive power smoothly from low-pollution energy sources such as photovoltaics or fuel cells to a power grid.

When grid voltage is distorted or three-phase voltage is unbalanced, these, however, work as disturbances in the grid current control system, thereby causing even the grid current to be distorted and unbalanced. Since controlling harmonic components of grid currents and improving unbalance of three-phase grid currents are more significant issues in the grid-connected inverter than in any other application field, a variety of methods have been published.

First of all, as low-frequency harmonic currents cannot be filtered well by grid line impedance, a heavy bulky passive LC filter is required. Accordingly, a method of increasing a bandwidth by increasing proportion and integral gain of a proportional integral (PI) controller has been proposed to reduce the harmonic currents by a control technique instead of such LC filter. This method may control the harmonic current, but reduce robustness of noise in a system. Next, a proportional resonant (PR) controller may be used to remove the harmonic current of a specific frequency, but as many PR controllers as the number of harmonics are required to use. In addition, if a harmonic to be removed is out of bandwidth of a system, the system may become unstable. A method of reducing the harmonic current of a specific currency by feed-forward control of harmonic voltage has been proposed, but it has problems of additional need for a detector circuit and its complicated computation. Meanwhile, when grid voltage becomes unbalanced, a grid current also becomes unbalanced. Therefore, power supplied to the grid vibrates.

In a power quality compensator and a power conversion system, accurately detecting grid voltage and phase is the most fundamental element for control. The performance of such quality compensator, which performs power factor compensation, harmonic current compensation, and voltage disturbance compensation, etc., depends on current reference or voltage reference created by a phase detector. In fact, the grid voltage contains a lot of harmonics generated by the harmonic currents produced by a lot of asymmetric loads.

As methods of detecting phase at single-phase voltage in a grid, there are a zero cross detection method using phase locked loop (PLL) and a method of using three-phase-concepted PLL by extending a single-phase one in d-q axes. However, the two methods cannot avoid harmonic problems in a distorted power system.

In particular, if PLL is performed by detecting distorted grid voltage, the stability of PCS (Power Conditioning System) control is significantly reduced.

DETAILED EXPLANATION OF THE INVENTION

Technical Problem

The object of the present invention is to provide a grid voltage phase detector capable of suppressing errors caused by unbalanced and harmonic components of a power grid.

In addition, the other object of the present invention is to increase operational stability of a PPL circuit equipped with a grid voltage phase detector and a PCS (Power Conditioning System) containing the PPL circuit.

Means of Solving the Problem

In accordance with one aspect of the present invention, a grid voltage phase detector may comprise: a d-q transformation unit for receiving a three-phase signal and producing a signal on d axis and a signal on q axis; a phase signal producing unit for producing a signal for phase synchronization of grid voltage from the signal on d axis and the signal on q axis; and a PR filtering unit, with a first filter having no change in magnitude and phase at a rated frequency, a second filter introducing 90° phase lead at a rated frequency, a third filter introducing 90° phase lag, and a fourth filter having no change in magnitude and phase at a rated frequency, for removing unbalanced components and harmonic components from the signal on d axis and the signal on q axis produced by the d-q transformation unit and providing the signals to the phase signal producing unit.

Herein, the signal on d axis may be inputted to the first filter and the third filter; the signal on q axis may be inputted to the second filter and the fourth filter; the output signal of the first filter and that of the second filter which are combined are halved and provided as a filtered signal on d axis to the phase signal producing unit; the output signal of the third filter and that of the fourth filter combined may be halved and provided as a filtered signal on q axis to the phase signal producing unit.

Herein, the first filter and the fourth filter individually may have a steep peak in a coordinate with frequency and magnitude in an exponential scale and have filtering characteristics of having 0 degrees phase at the rated frequency, −90 degrees phase at upper frequencies belonging to filtering cutoff frequencies, and 90 degrees phase at low frequencies belonging thereto in a coordinate with frequency and phase in an exponential scale;

the second filter may have a steep peak in a coordinate with frequency and magnitude in an exponential scale and has filtering characteristics of having 90 degrees phase at the rated frequency, 0 degrees phase at upper frequencies belonging to filtering cutoff frequencies, and 180 degrees phase at low frequencies belonging thereto in a coordinate with frequency and phase in an exponential scale; and the third filter may have a steep peak in a coordinate with frequency and magnitude in an exponential scale and has filtering characteristics of having −90 degrees phase at the rated frequency, 0 degrees phase at upper frequencies belonging to filtering cutoff frequencies, and −180 degrees phase at low frequencies belonging thereto in a coordinate with frequency and phase in an exponential scale.

Herein, the first filter and the fourth filter individually may have filtering characteristics of having a form of bilateral symmetry divided into equal right and left sides based around the rated frequency point in the coordinate with frequency and magnitude in an exponential scale;

the second filter may have filtering characteristics of having points falling near to almost a straight sloped line at upper frequencies belonging to the filtering cutoff frequencies and having almost a certain magnitude at lower frequencies belonging thereto in the coordinate with frequency and magnitude in an exponential scale;

the third filter has filtering characteristics of having points falling near to almost a straight sloped line at lower frequencies belonging to the filtering cutoff frequencies and having almost a certain magnitude at upper frequencies belonging thereto in the coordinate with frequency and magnitude in an exponential scale.

Herein, the first filter and the fourth filter individually may have filtering characteristics in accordance with a Laplace's Formula below in coordinates:

$$G_{PR\_C}(s) = \frac{k\omega_c s}{s^2 + k\omega_c s + \omega^2};$$

the second filter may have filtering characteristics in accordance with a Laplace's Formula below in coordinates:

$$G_{PR\_SN}(s) = \frac{-k\omega_c \omega}{s^2 + k\omega_c s + \omega^2};$$

and the third filter may have filtering characteristics in accordance with a Laplace's Formula below in coordinates:

$$G_{PR\_SP}(s) = \frac{k\omega_c \omega}{s^2 + k\omega_c s + \omega^2}$$

where in above three Laplace's Formulas, $\omega$ is resonance frequency; k is a damping element; and $\omega_c$ is cutoff frequency.

Herein, the PR filtering unit may be a digital filter for receiving a detected grid voltage signal as digital value and digitally transforming the value in accordance with predetermined transformation Formulas.

Effects of the Invention

A grid voltage phase detector of the present invention if being embodied in accordance with a configuration has an effect of controlling errors by unbalanced and harmonic components of grid voltage.

In addition, the grid voltage phase detector of the present invention has an effect of making a phased locked loop circuit equipped therewith capable of tracking accurate frequency and voltage magnitude of grid at distorted grid voltage.

Besides, the grid voltage phase detector of the present invention has an effect of reducing maintenance costs because it is capable of improving reliability of a PCS (Power Conditioning System) and being operated stably even in a weak grid.

DETAILED DESCRIPTION OF THE PREFERRED EMBODIMENTS

Detailed example embodiments to implement the present invention will be explained below by referring to attached drawings.

Upon the explanation of the present invention, terms such as "a first," "a second," etc. may be used to explain a variety of components but the components may not be limited by such terms. The terms are used only for the purpose of distinguishing one component from another. For example, a first component may be named as a second component without being beyond the scope of the right of the present invention and similarly, even a second component may be named as a first one.

If it is mentioned that a component is connected or linked to another component, it may be understood that the component may be directly connected or linked to the another component but also a third component may exist in between them.

The terms used in this specification are used only to explain specific example embodiments and they are not intended to limit the present invention. Unless a context clearly indicates a different meaning, any reference to singular may include plural ones.

In this specification, terms such as include or equip are used to indicate that there are features, numbers, steps, operations, components, parts or combinations thereof, and it can be understood that existence or one or more different features, numbers, steps, operations, components, parts or combinations thereof are not precluded.

Besides, for clearer explanation, shapes, magnitudes, etc. of elements in drawings may be exaggerated.

Figure 1:
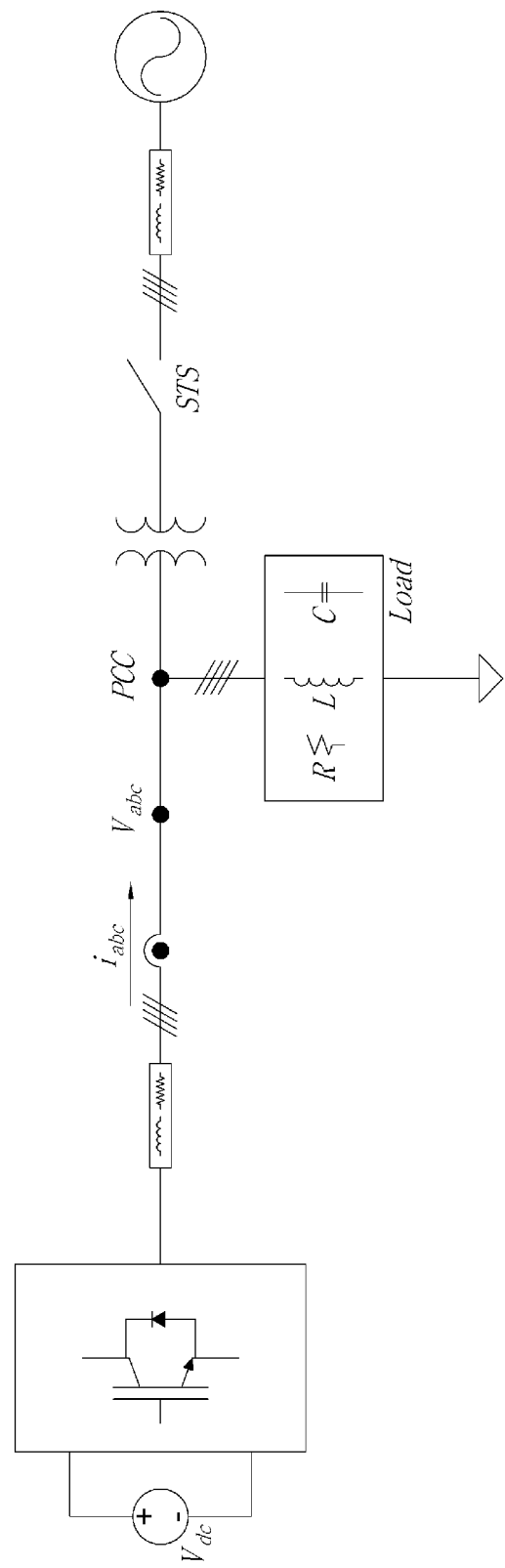
FIG. 1 illustrates measuring points of individual measure values for PLL control in a structure of supplying power to a grid.

FIG. 1 illustrates measuring points of individual measure values for PLL control in a structure of supplying power to a grid.

Figure 2:
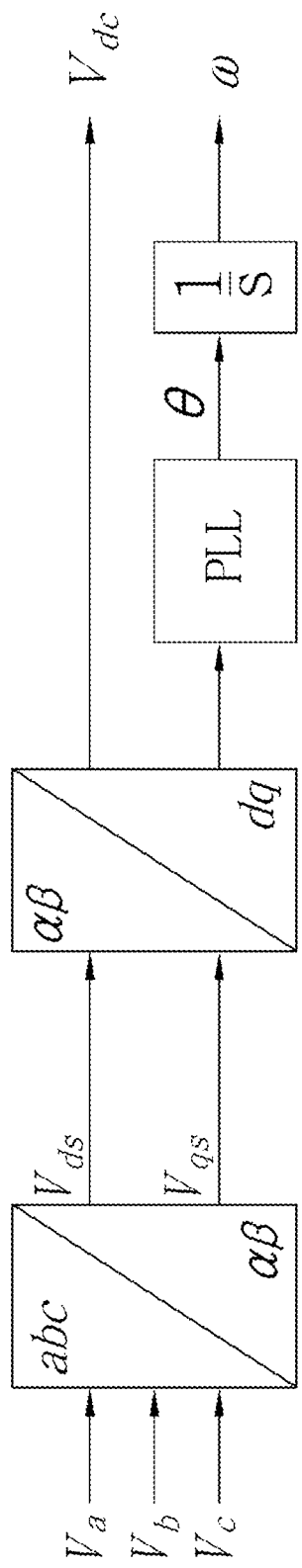
FIG. 2 is a block diagram illustrating a general PLL controlling circuit.

FIG. 2 is a block diagram illustrating a general PLL controlling circuit.

A general PLL method controls operation of a PCS (Power Conditioning System) to track grid voltage magnitude Vde and frequency ω by detecting voltages Vabc. i.e., Va, Vb, Vc.

Figure 3:
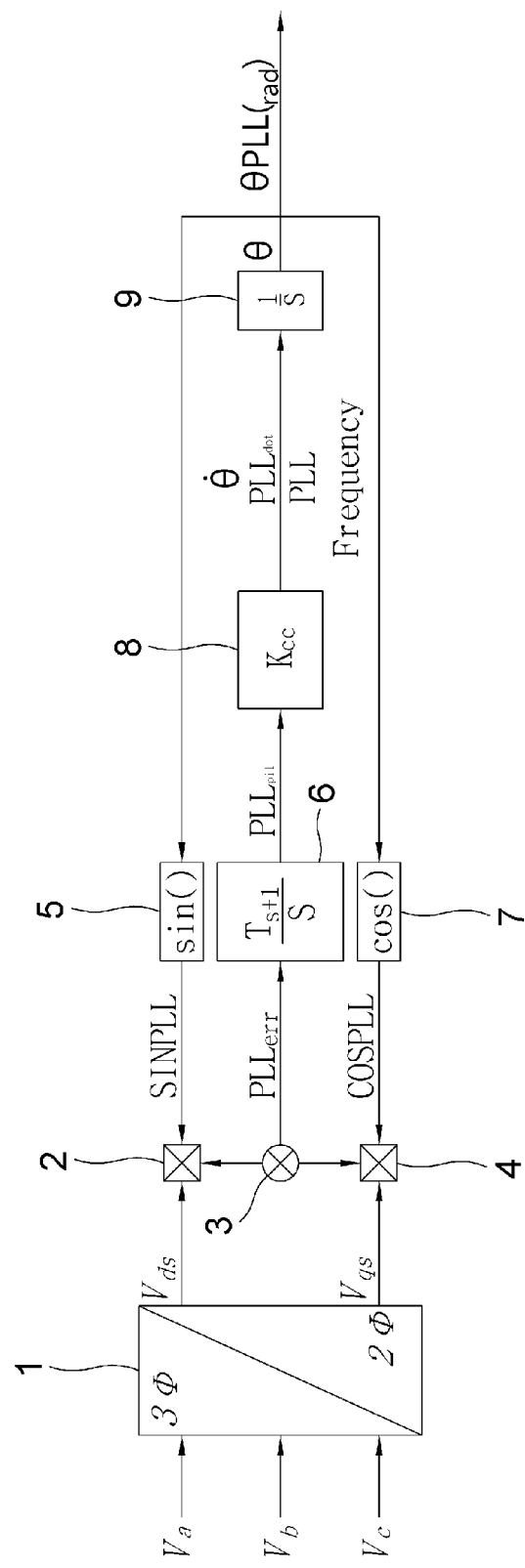
FIG. 3 is a more specified block diagram of the general PPL structure.

FIG. 3 is a more specified block diagram of the general PPL structure.

By referring to FIG. 3, if three-phase AC voltage signals Va, Vb, Vc, as input signals in an existing PLL circuit, are inputted, a dq converter 1 may convert them into dq conversion and output voltage signals Vds, Vqs. Next, the voltage signals Vds, Vqs may be multiplied by PLL signals SINPLL. COSPLL respectively through multipliers 2, 4, and be outputted to a PLL error signal Pllerr through a adder 3. Herein, Vqs*COSPLL=Vds*SINPLL. If the PLL error signal becomes 0, it would be an ideal PLL circuit. At the time, if a PLL error signal has a certain value, a PLL signal θ PLL is generated via an integrator 6, a gain controller 8 and an integrator 9 to make it close to 0.

Figure 4:
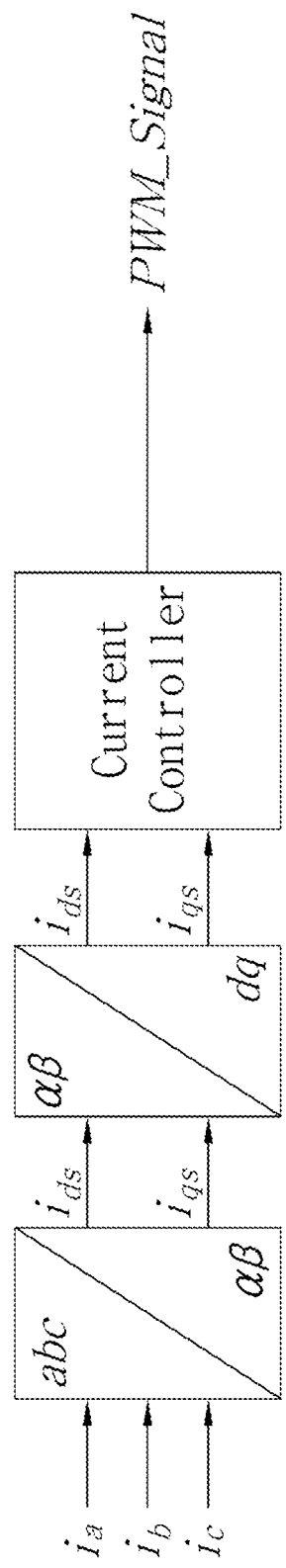
FIG. 4 is a block diagram showing a current control structure through PLL control.

FIG. 4 is a block diagram showing a current control structure through PLL control.

Because the illustrated PLL control controls the current with the controlled frequency ω in FIGS. 2 and 3, if an accurate grid frequency cannot be found, stability of PLL control would be reduced.

As explained above, the present invention suggests a method of detecting accurate voltage phase even though unbalanced and harmonic components are mixed in the grid voltage.

Figure 5:
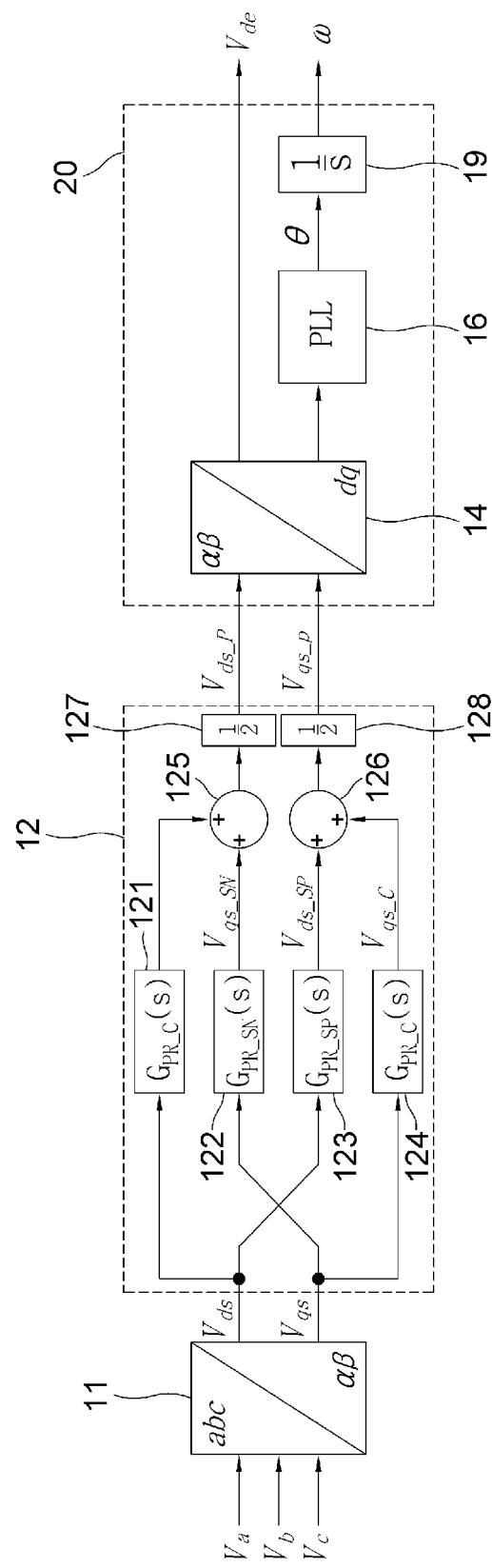
FIG. 5 is a block diagram showing a PLL controlling circuit in accordance with the thought of the present invention.

FIG. 5 is a block diagram showing a PLL controlling circuit in accordance with the thought of the present invention.

In accordance with one example embodiment of the present invention composed of the illustrated PLL controlling circuit, the grid voltage phase detector includes a d-q transformation unit 11 for receiving a three-phase signal and producing a signal on d axis and a signal on q axis; a phase signal producing unit 20 for producing a signal for phase synchronization of grid voltage from the signal on d axis and the signal on q axis; and a PR filtering unit 12 for removing unbalanced components and harmonic components from the signal on d axis and the signal on q axis produced by the d-q transformation unit and providing the signals to the phase signal producing unit.

The PR filtering unit 12 has a first filter 121 having no change in magnitude and phase at a rated or resonant frequency, a second filter 122 introducing 90° phase lead at a rated frequency, a third filter 123 introducing 90° phase lag, and a fourth filter 124 having no change in magnitude and phase at a rated frequency.

As illustrated, the signal on d axis outputted from the d-q transformation unit 11 is inputted to the first filter 121 and the third filter 123, and the signal on q axis is inputted to the second filter 122 and the fourth filter 124. An output signal of the first filter 121 and that of the second filter 122 are provided to the phase signal producing unit 20 as a signal $V_{ds\_P}$ on d axis summed up by a signal adder 125 and then half-cut and filtered by a signal half-cutter 127, and an output signal of the third filter 123 and that of the fourth filter 124 are provided to the phase signal producing unit 20 as a signal $V_{qs\_P}$ on q axis summed up by a signal adder 126 and then half-cut and filtered by a signal half-cutter 128.

The illustrated d-q transformation unit 11 may receive three-phase voltage signals Va, Vb, Vc, make d-q transformation, and produce a stationary signal of two axes. In accordance with this example embodiment, a three-phase voltage signal is inputted in the d-q transformation unit 11, but also a three-phase current signal may be inputted. Even a random three-phase signal may be inputted. More specifically, the d-q transformation unit 11 may receive output three-phase voltage signals Va, Vb, Vc and output a signal Vds on the d axis and a signal Vqs on the q axis through Formula 1.

$$\begin{bmatrix} V_{ds} \\ V_{qs} \\ V_0 \end{bmatrix} = \sqrt{\frac{2}{3}} * \begin{bmatrix} 1 & -\frac{1}{2} & -\frac{1}{2} \\ 0 & \frac{\sqrt{3}}{2} & -\frac{\sqrt{3}}{2} \\ 1 & 1 & 1 \end{bmatrix} * \begin{bmatrix} V_a \\ V_b \\ V_0 \end{bmatrix} \quad \text{[Formula 1]}$$

The phase signal producing unit 20 illustrated in FIG. 5 receives the filtered signal $V_{ds\_P}$ on d axis and the filtered signal $V_{qs\_P}$ on q axis, and controls phase angle and voltage of the grid power through coordinate transformation and PI control. In accordance with the embodiment, another configuration for estimating the grid voltage and the phase angle, for example, a configuration of FIG. 3, may be followed.

Next, operation of the PR filtering unit 12, which is the center of the thought of the present invention, will be explained.

Figure 6A:
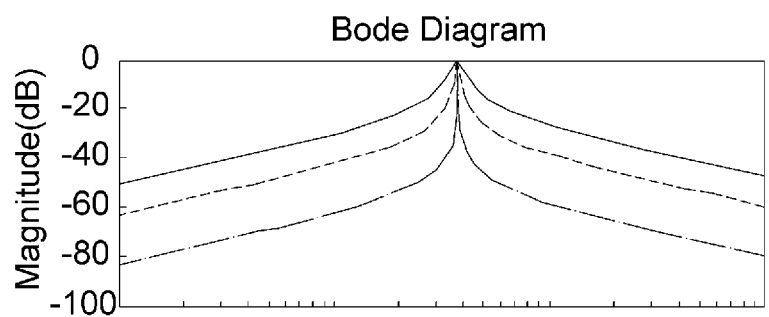
FIGS. 6A and 6B are graphs showing filtering characteristics of $G_{PR\_C}(s)$ depending on k.
Figure 6B:
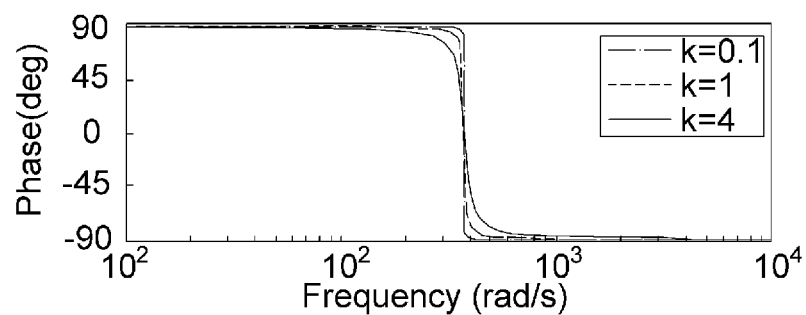

FIGS. 6A and 6B are graphs showing filtering characteristics of the first filter 121 and the fourth filter 124, and the filtering characteristics illustrated in the graphs are based on Formula 2 as Laplace's Formula in the coordinates as seen below.

$$G_{PR\_C}(s) = \frac{k\omega_c s}{s^2 + k\omega_2 s + \omega^2} \quad \text{[Formula 2]}$$

The graphs of FIG. 6A regarding the first filter 121 and the fourth filter 124 show they have steep peaks at the rated frequency and represent forms (i.e., filtering characteristics) of symmetry around a rated frequency point as an axis in the coordinate with frequency and magnitude in an exponential scale.

The graphs of FIG. 6B regarding the first filter 121 and the fourth filter 124 show they have forms as filtering characteristics of having 0 degrees phase at the rated frequency, −90 degrees phase at upper frequencies belonging to filtering cutoff frequencies, and 90 degrees phase at low frequencies belonging thereto in a coordinate with frequency and phase in an exponential scale.

Figure 7A:
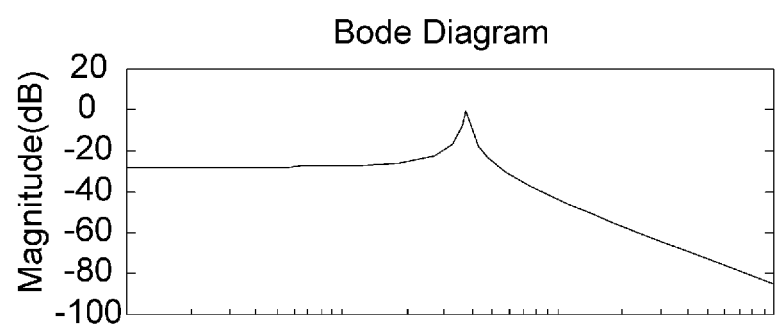
FIGS. 7A and 7B are graphs illustrating filtering characteristics of $G_{PR\_SP}(s)$.
Figure 7B:
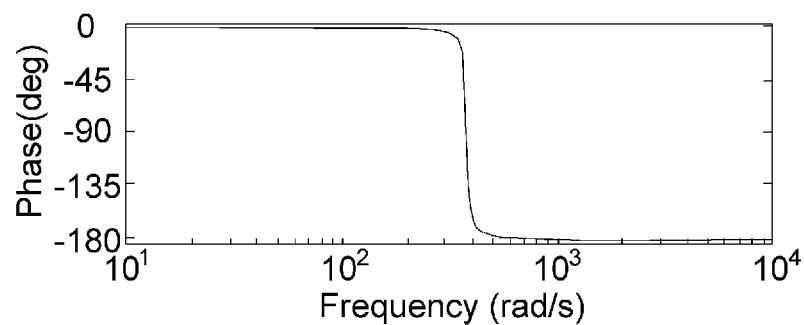

FIGS. 7A and 7B are graphs showing filtering characteristics of the second filter 122, and the filtering characteristics illustrated in the graphs are based on Formula 3 as Laplace's Formula in the coordinates as seen below.

$$G_{PR\_SN}(s) = \frac{-k\omega_c \omega}{s^2 + k\omega_c s + \omega^2} \quad \text{[Formula 3]}$$

The graph of the second filter 122 in FIG. 7A shows that the second filter has a form as a filtering characteristic of having a steep peak at the rated frequency and points falling near to almost a straight sloped line at upper frequencies belonging to the filtering cutoff frequencies and having almost a certain magnitude at lower frequencies belonging thereto in the coordinate with frequency and magnitude in an exponential scale.

The graph of the second filter 122 in FIG. 7B shows that it has a steep peak in a coordinate with frequency and magnitude in an exponential scale and has a form as a filtering characteristic of having 90 degrees phase at the rated frequency, 0 degrees phase at upper frequencies belonging to filtering cutoff frequencies, and 180 degrees phase at low frequencies belonging thereto in a coordinate with frequency and phase in an exponential scale.

Figure 8A:
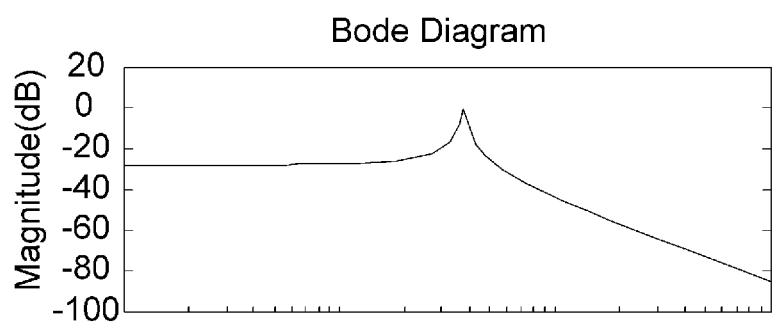
FIGS. 8A and 8B are graphs illustrating filtering characteristics of $G_{PR\_SN}(s)$.
Figure 8B:
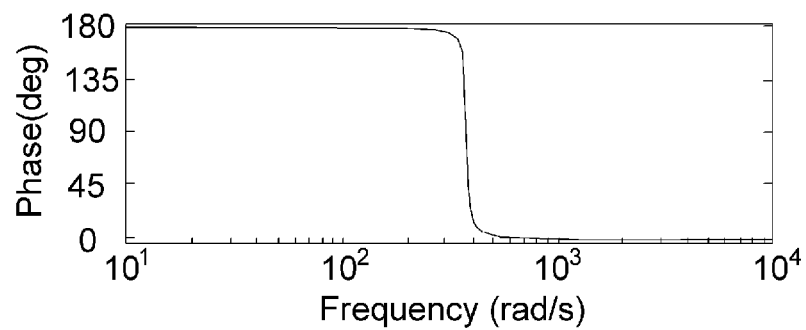

FIGS. 8A and 8B are graphs showing filtering characteristics of the second filter 123, and the filtering characteristics illustrated in the graphs are based on Formula 4 as Laplace's Formula in the coordinates as seen below.

$$G_{PR\_SP}(s) = \frac{k\omega_c \omega}{s^2 + k\omega_c s + \omega^2} \quad \text{[Formula 4]}$$

The graph of the third filter 123 in FIG. 8A represents that it has a steep peak in a coordinate with frequency and magnitude in an exponential scale and has a form as a filtering characteristic of having points falling near to almost a straight sloped line at lower frequencies belonging to the filtering cutoff frequencies and having almost a certain magnitude at upper frequencies belonging thereto in the coordinate with frequency and magnitude in an exponential scale.

The graph of the third filter 123 in FIG. 8B illustrates that it has a form as a filtering characteristic of having −90 degrees phase at the rated frequency, 0 degrees phase at upper frequencies belonging to filtering cutoff frequencies, and −180 degrees phase at low frequencies belonging thereto in a coordinate with frequency and phase in an exponential scale.

Next, operating principles of the components of the PR filtering unit 12 which is the center of the thought of the present invention will be explained.

To accurately detect grid voltage magnitude and frequencies at unbalanced and distorted voltages, a technique of accurately extracting positive sequence and negative sequence is required. Voltages from three-phases in stationary coordinates may be converted to two-phase AC voltages, and accurate positive sequence and negative sequence are extracted at unbalanced voltages using a filter. The unbalanced voltages of the general three-phase grid may be summarized as shown in Formula 5 below at following positive sequence and negative sequence. At the time, it is supposed that there exists no negative sequence voltage.

$$v_a = V_p \cos(\omega t + \phi_p) + V_n \cos(\omega t + \phi_n) \quad \text{[Formula 5]}$$
$$v_b = V_p \cos\left(\omega t - \frac{2}{3}\pi + \phi_p\right) + V_n \cos\left(\omega t + \frac{2}{3}\pi + \phi_n\right)$$
$$v_b = V_p \cos\left(\omega t + \frac{2}{3}\pi + \phi_p\right) + V_n \cos\left(\omega t - \frac{2}{3}\pi + \phi_n\right)$$

where $V_p$ and $V_n$ represent the maximum values of the positive sequence and the negative sequence, respectively.

In accordance with the thought of the present invention, positive sequence and a negative sequence are simply extracted in the stationary coordinates by using three types of unit PR filters with transfer functions such as Formula 2. Formula 3 and Formula 4 to independently separate the positive sequence voltage from the negative sequence voltage shown in Formula 5.

In the Formulae, $\omega$ is a resonance frequency, k is a damping element, and $\omega_c$ is a cutoff frequency. PR filters may extract ingredients of specific frequencies regardless of magnitude and phase delay. The performance of PR filters is determined by the value of k as a damping element.

FIGS. 6A and 6B represent frequency response depending on the value of the Formula 2. As When the value of k is reduced, as can be seen from frequency response, precise filter response could be brought, but due to the bandwidth narrowed, filter delay occurs. In general, for critically-damped response, k is set to $k=(2)^{1/2}$.

Similarly, the Formulae 3 and 4 show same frequency responses as FIGS. 7A, 7B, 8A and 8B. These bring a filtering effect of 90° phase lead and 90° phase lag without any change in magnitude near the rated frequency (377 rad/s).

Accordingly, the positive sequence and the negative sequence may be accurately and simply extracted in the stationary coordinates through the unit PR filters with the three characteristics. If the Formula 5 is used for following Formulae 6 and 7 as Formulae for stationary coordinate transformation, the unbalanced three-phase voltage is expressed as two-phase voltage like the following Formulae 8 and 9.

$$v_{ds} = \frac{2v_a - v_b - v_c}{3} \quad \text{[Formula 6]}$$
$$v_{qs} = \frac{1}{\sqrt{3}}(v_b - v_c) \quad \text{[Formula 7]}$$
$$v_{ds} = V_p \cos(\omega t + \phi_p) + V_n \cos(\omega t + \phi_n) \quad \text{[Formula 8]}$$
$$v_{qs} = V_n \sin(\omega t + \phi_p) V_n \sin(\omega t + \phi_n) \quad \text{[Formula 9]}$$

Figure 9:
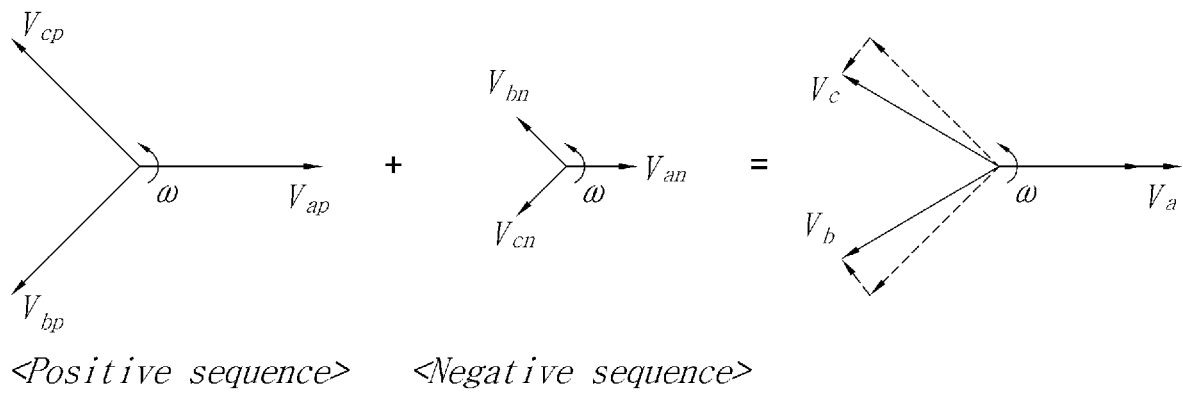
FIG. 9 is a phasor diagram showing combination of positive sequence and negative sequence of three-phase unbalanced voltage.

Herein, the Formula 5 may be expressed as a phasor diagram illustrated in FIG. 9.

Figure 10:
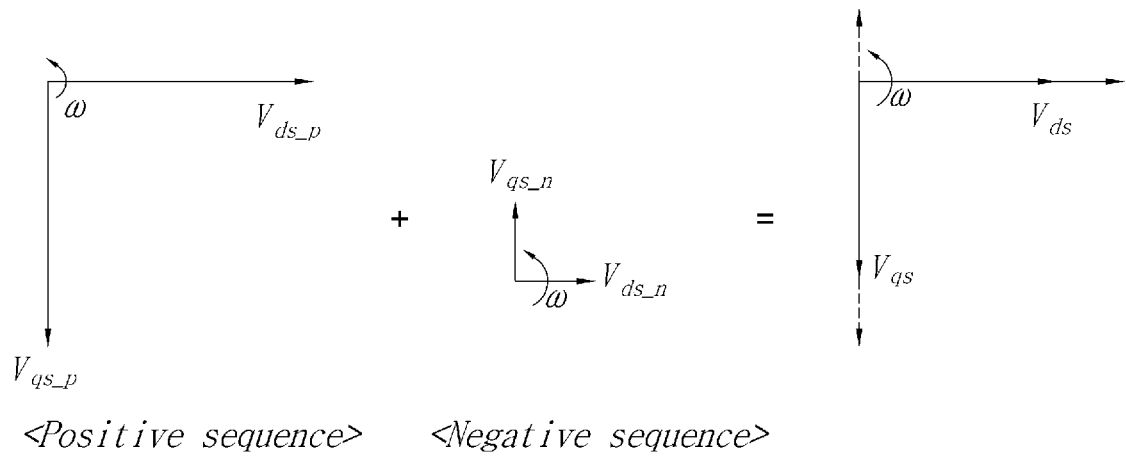
FIG. 10 is a phasor diagram showing unbalanced voltage transformed in two-phase dq stationary coordinates in terms of the d and q axis components.

FIG. 9 is a phasor diagram showing combination of positive sequence and negative sequence of three-phase unbalanced voltage, and FIG. 10 is a phasor diagram showing the d and q axis components in the Formulae 8 and 9 where unbalanced voltage is transformed in two-phase dq stationary coordinates.

If the unbalanced three-phase voltage is transformed into stationary, it can be identified that the positive sequence voltage and the negative sequence voltage of three-phase are same as the values independently converted. Accordingly, if the positive sequence voltage and the negative sequence voltage are extracted in stationary coordinates, it could reduce the volume of computation.

A method of extracting positive sequence voltage and negative sequence voltage proposed in the present invention is made through phase change by using PR filters in the stationary coordinates transformed. A control block diagram to obtain expressions of positive sequence voltage obtained from two phase unbalanced voltage is shown in FIG. 11.

Figure 11:
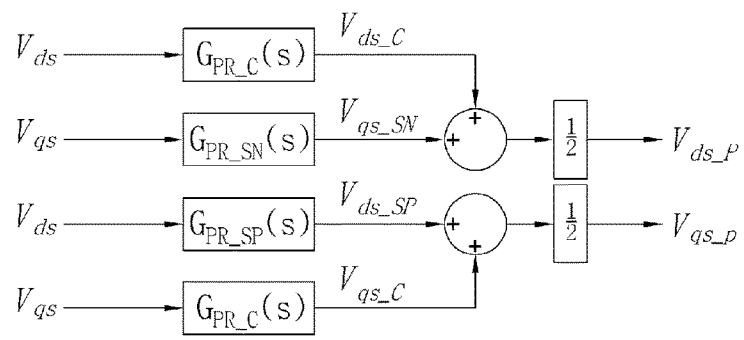
FIG. 11 is a control block diagram to obtain expressions of positive sequence voltage on the d-q axes from two phase unbalanced voltage.

Given the control block diagram in FIG. 11, to obtain a positive sequence voltage $v_{ds\_p}$ on the d-axis in the stationary coordinates, voltage $v_{ds}$ which include positive sequence voltage and negative sequence voltage is filtered through $G_{PR\_C}(s)$ that may extract only the rated frequency without phase delay. If harmonic voltage is mixed in $v_{ds\_p}$ by performing filtering, the harmonic voltage component may be reduced. In addition, voltage $v_q$s which includes the positive sequence voltage and the negative sequence voltage is filtered through $G_{PR\_SN}(s)$ which makes 90° phase lead. By multiplying the sum of $v_{ds\_C}$ and $v_{qs\_SN}$ as outputs of filters $G_{PR\_C}(s)$ and $G_{PR\_SN}(S)$ by ½, only the positive sequence voltage $v_{ds\_p}$ on the d axis may be extracted at two-phase unbalanced voltage in the stationary coordinates.

Figure 12:
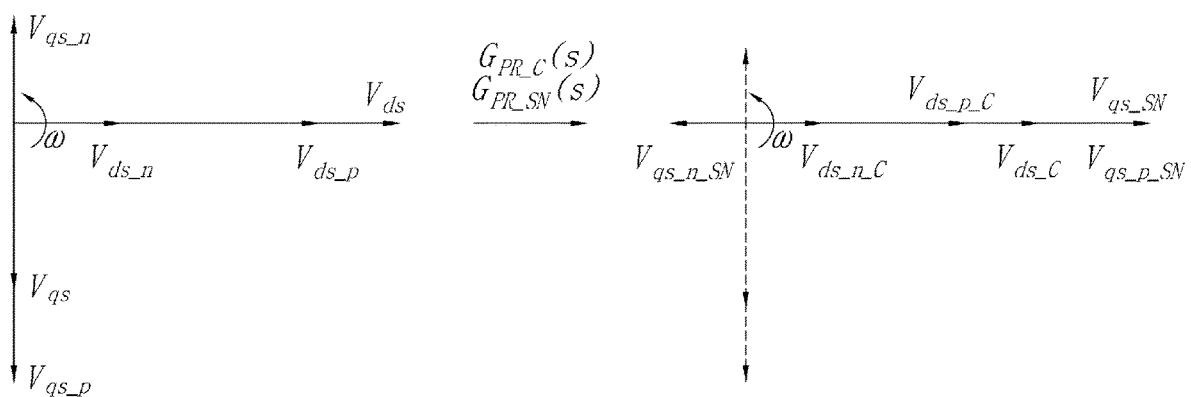
FIG. 12 shows phasor diagrams representing a course of extracting positive sequence voltage on the d-axis.

FIG. 12 shows phasor diagrams to obtain positive sequence voltage on the d axis as analyzed above. Looking at the illustrated phasor diagram, $v_{ds}$, as unbalanced two-phase voltage on the d axis and $v_{qs}$ as voltage on the q axis are filtered to obtain $v_{ds\_p}$ as the positive sequence voltage on the d axis through $G_{PR\_C}(s)$ and $G_{PR\_SN}(S)$, respectively. Both the filtered voltage $v_{ds\_C}$ and $v_{qs\_SN}$ have the same phase on the d axis. At the time, $v_{ds\_p\_C}$ and $v_{qs\_n\_C}$ as positive sequence voltages on d-q axes have the same phase, and $v_{ds\_n\_SN}$ and $v_{qs\_n\_SN}$ as negative sequence voltages on d-q axes have 180° of phase.

The phasor diagram in FIG. 12 is expressed like the Formula 10 and the Formula 11, and as a result, the voltage on the d axis from the unbalanced two-phase voltage may be obtained as seen in the Formula 12.

$$v_{ds\_C} = V_p\cos(\omega t + \phi_p) + V_n\cos(\omega t + \phi_n) \quad \text{[Formula 10]}$$

$$v_{qs\_SN} = V_p\cos(\omega t + \phi_p) - V_n\cos(\omega t + \phi_n) \quad \text{[Formula 11]}$$

$$v_{ds\_p} = \frac{v_{ds\_C} + v_{qs\_SN}}{2} = V_p\cos(\omega t + \phi_p) \quad \text{[Formula 12]}$$

Figure 13:
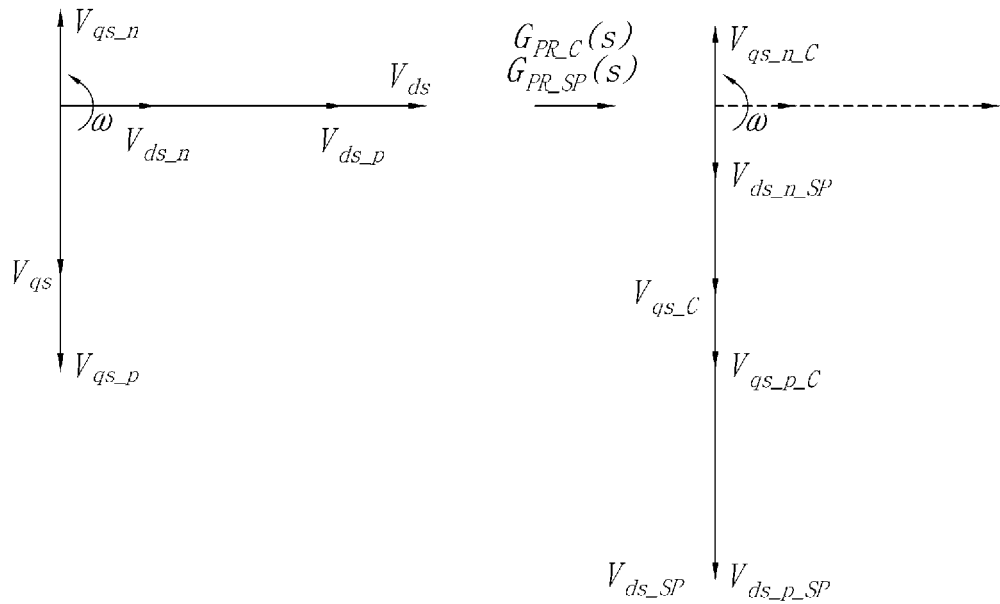
FIG. 13 shows phasor diagrams representing a course of extracting positive sequence voltage on the q axis.

To obtain $v_{qs\_p}$ as positive sequence voltage on the q axis from the unbalanced two-phase voltage, v a, as voltage on the d axis and v q, as voltage on the q axis respectively are filtered through transfer functions $G_{PR\_SP}(s)$ and $G_{PR\_C}(s)$. All the positive sequence voltages of the filtered voltages $v_{ds\_SP}$ and $v_{qs\_C}$ have the same phase as the voltage on the q axis, and the negative sequence voltages thereof are offset with the voltage having 180° phase difference with the same magnitude. FIG. 13 shows phasor diagrams representing positive sequence voltage on the q axis.

The phasor diagram in FIG. 13 is expressed like the Formulae 13 and 14, and as a result, the positive sequence voltage on the q axis may be obtained as seen in the Formula 15.

$$v_{ds\_SP} = V_p\sin(\omega t + \phi_p) + V_n\sin(\omega t + \phi_n) \quad \text{[Formula 13]}$$

$$v_{qs\_C} = V_p\sin(\omega t + \phi_p)V_n\sin(\omega t + \phi_n) \quad \text{[Formula 14]}$$

$$v_{qs\_p} = \frac{v_{ds\_SP} + v_{qs\_C}}{2} = V_n\sin(\omega t + \phi_n) \quad \text{[Formula 15]}$$

If a general PLL method is performed with the positive sequence voltage, the magnitude and frequency of the grid voltage may be accurately detected.

A method of obtaining the negative sequence voltage is similar to a method of obtaining the positive sequence voltage. A control block diagram to obtain expressions of negative sequence voltage on the d-q axes obtained from two phase unbalanced voltage is illustrated in FIG. 14.

Figure 14:
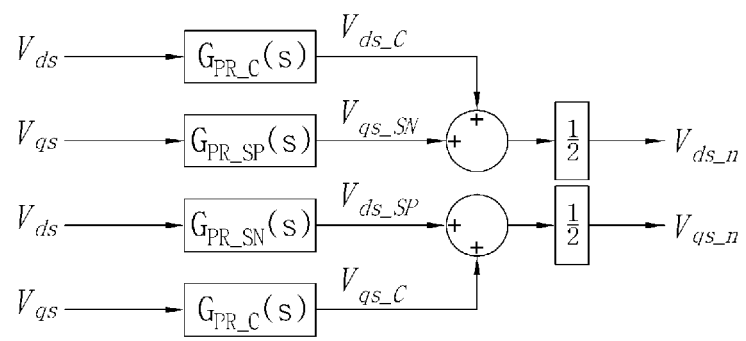
FIG. 14 is a control block diagram to obtain expressions of negative sequence voltage on the d-q axes from two phase unbalanced voltage.
Figure 15:
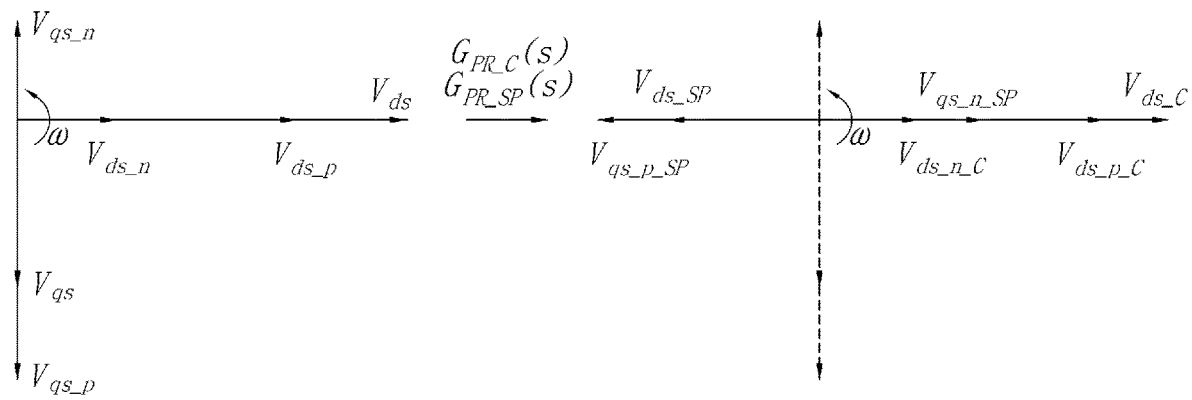
FIG. 15 shows phasor diagrams representing a course of extracting negative sequence voltage on the d-axis.

Looking at the controlled block diagram illustrated in the FIG. 14, to obtain $v_{ds\_n}$, a negative sequence voltage on the d axis in the stationary coordinates, voltage $v_{ds}$ is filtered through $G_{PR\_C}(s)$ which may extract only the rated frequency without phase delay. In addition, voltage $v_{qs}$ is filtered through $G_{PR\_SP}(s)$ that introduces 90° lag. By multiplying the sum of $v_{ds\_C}$ and $v_{qs\_SP}$ as outputs of the filters $G_{PR\_C}(s)$ and $G_{PR\_SP}(s)$ by ½, $v_{ds\_n}$ as negative sequence voltage on the d axis in the stationary coordinates. FIG. 15 shows phasor diagrams representing a course of extracting negative sequence voltage on the d axis as analyzed above.

FIG. 15 shows phasor diagrams to obtain negative sequence voltage on the d axis as analyzed above. Looking at the illustrated phasor diagram, unbalanced two-phase voltages are filtered to obtain the negative sequence voltages. The negative sequence voltages of the filtered voltage have the same phase on the axes and positive sequence voltages on the axes are offset with the voltage having 180° phase difference with the same magnitude.

This is expressed like Formulae 16 and 17 as seen below, and the negative sequence voltage on the d axis may be obtained like Formula 18 by dividing the sum of the Formulae 16 and 17 by 2.

$$v_{ds\_C} = V_p\cos(\omega t + \phi_p) + V_n\cos(\omega t + \phi_n) \quad \text{[Formula 16]}$$

$$v_{qs\_SP} = -V_p\cos(\omega t + \phi_p) + V_n\cos(\omega t + \phi_n) \quad \text{[Formula 17]}$$

$$v_{ds\_n} = \frac{v_{ds\_C} + v_{qs\_SP}}{2} = V_n\cos(\omega t + \phi_n) \quad \text{[Formula 18]}$$

Figure 16:
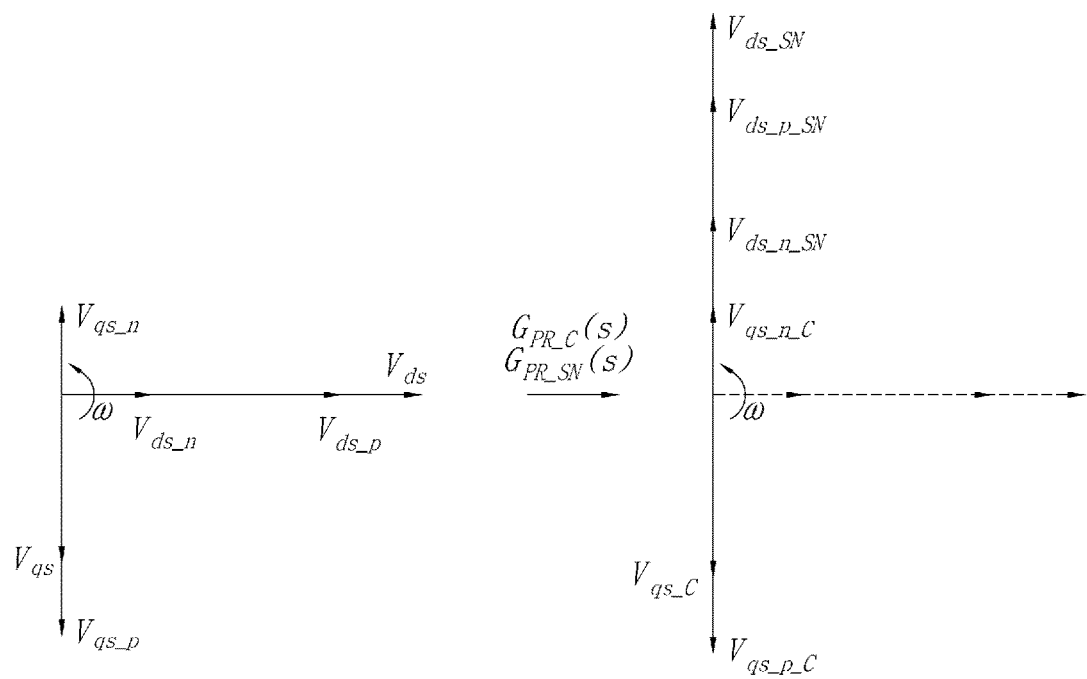
FIG. 16 shows phasor diagrams representing a course of extracting negative sequence voltage on the q axis.

To obtain $v_{qs\_n}$ as negative sequence voltage on the q axis, $v_{ds}$ as voltage on the d axis and $v_{qs}$ as voltage on the q axis respectively are filtered through transfer functions $G_{PR\_SN}(s)$ and $G_{PR\_C}(s)$. All the negative sequence voltages of the filtered voltages have same phase as the voltage on the q axis, and the positive sequence voltages thereof are offset with the voltage having 180° phase difference with the same magnitude. FIG. 16 shows phasor diagrams representing a course of extracting negative sequence voltage on the q axis.

This is expressed like Formulae 19 and 20 as seen below, and the negative sequence voltage on the q axis may be obtained like Formula 21 by dividing the sum of the Formula 19 and the Formula 20 by 2.

$$v_{ds\_SN} = V_p\sin(\omega t + \phi_p) + V_n\sin(\omega t + \phi_n) \quad \text{[Formula 19]}$$

$$v_{qs\_C} = V_p\sin(\omega t + \phi_p) - V_n\sin(\omega t + \phi_n) \quad \text{[Formula 20]}$$

$$v_{qs\_p} = \frac{v_{ds\_SN} + v_{qs\_C}}{2} = V_n\sin(\omega t + \phi_n) \quad \text{[Formula 21]}$$

Figure 17:
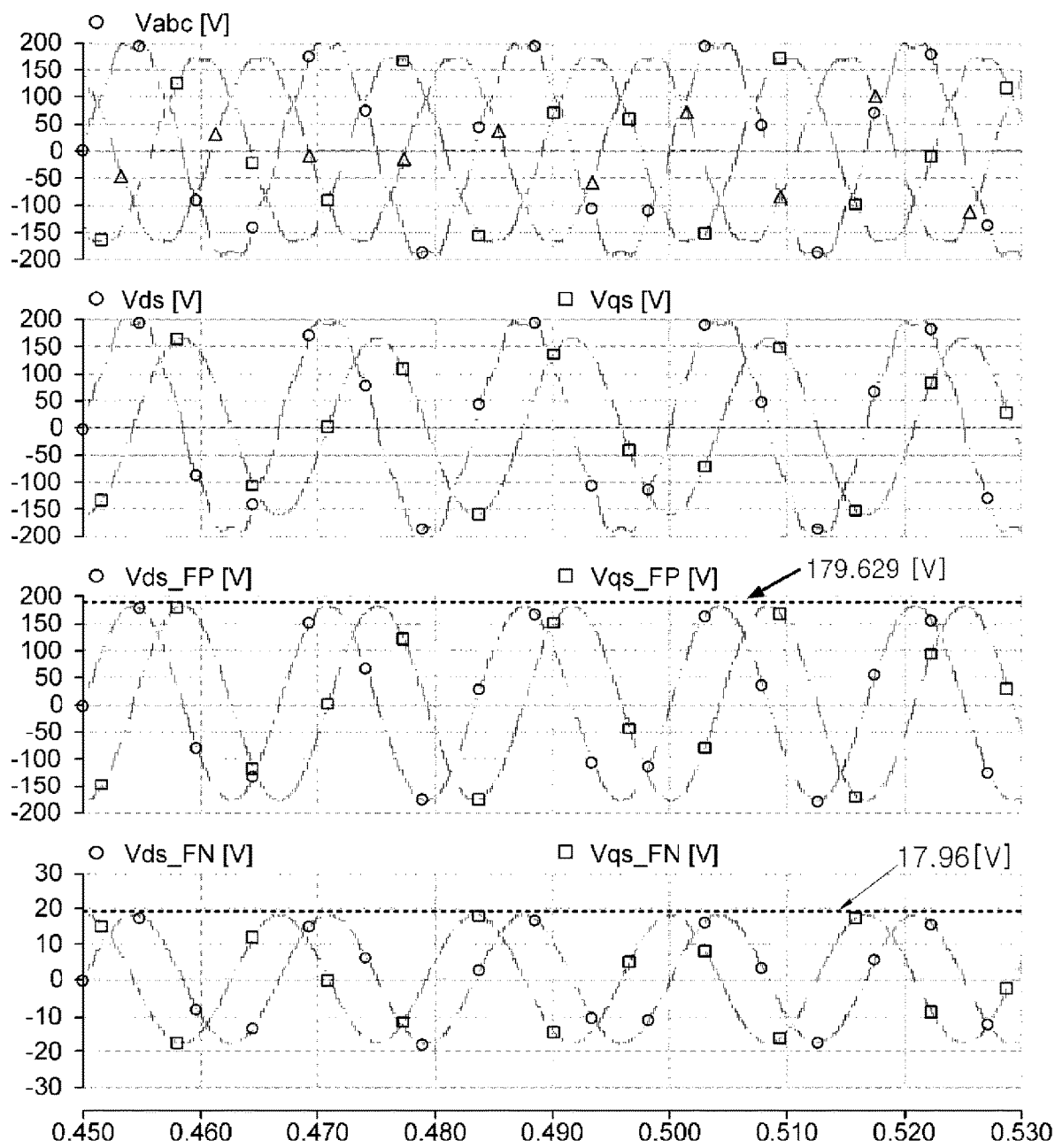
FIG. 17 is wave simulation diagrams to extract positive sequence and negative sequence from unbalanced voltages.

Based on the theoretical analysis seen above, simulations were performed through PSCAD/EMTDC. FIG. 17 shows simulation waveforms extracting the positive sequence component and the negative sequence voltage at the unbalanced voltage. At the time, Vp=179.629[V], and Vn=17.96[V]. The negative sequence voltage compared to the positive sequence voltage was set to 10%. In addition, seven random harmonics were included roughly by 3%. FIG. 17 shows voltage waveforms of unbalanced three-phase voltage, unbalanced two-phase voltage on d and q axes in stationary coordinates, and extracted positive and negative dq-axis voltage from the top.

As mentioned above, the unbalanced three-phase voltage was expressed as two-phase voltage through the transformation of the stationary coordinates. At the time, the voltage may be extracted from two-phase independent positive sequence voltage and negative sequence voltage through a method of proposing the unbalanced two-phase voltage. At the time, as the positive sequence dq-axis voltage, 179.629 [V] that is the maximum value of the three-phase positive sequence voltage was accurately extracted, and as negative sequence voltage, 17.96[v] that is 10% of the positive sequence voltage, was accurately extracted. As a result, it may be composed of independent positive and negative sequence voltage controllers through the method proposed in the present invention. At the time, the positive sequence voltage controller performs droop control as suggested above, and the negative sequence voltage controller controls the output voltage to 0V to compensate for unbalanced voltage.

In accordance with the thought of the present invention, the PR filtering unit 12 may be implemented with an analog filter circuit composed of passive and active circuit elements, but it would be advantageous to make implementation with a digital filter which performs transformation of digital values to be inputted by converting detected grid voltage signals to AD from the aspects of easiness in implementation and adjustment. For example, the digital filter may be equipped with a DSP for performing digital transformation under the Formulae or an AD converter configured for converting analog signals detecting a grid voltage to digital values.

It must be noted that the aforementioned example embodiment is for explanation, not for limitation. Besides, it will be understood by those skilled in the art to which the present invention pertains that a variety of example embodiments are possible within the scope of technical thoughts of the present invention.

REFERENCE NUMBERS

11: A d-q transformation unit
12: PR filtering unit
20: phase signal producing unit

INDUSTRIAL AVAILABILITY

The present invention relates to a grid voltage phase detector, and is available in the field of power grid control.

What is claimed is:

1. A grid voltage phase detector, comprising:
a d-q transformer for receiving a three-phase signal and producing a signal on d axis and a signal on q axis;
a phase signal producer for producing a signal for phase synchronization of grid voltage from the signal on d axis and the signal on q axis; and
a proportional resonant (PR) filter, with a first filter having no change in magnitude and phase at a rated frequency, a second filter introducing 90° phase lead at a rated frequency, a third filter introducing 90° phase lag, and a fourth filter having no change in magnitude and phase at a rated frequency, for removing unbalanced components and harmonic components from the signal on d axis and the signal on q axis produced by the d-q transformer and providing signals to the phase signal producer,
wherein:
the first filter and the fourth filter individually have a steep peak in a coordinate with frequency and magnitude in an exponential scale and have filtering characteristics of having 0 degrees phase at the rated frequency, −90 degrees phase at upper frequencies belonging to filtering cutoff frequencies, and 90 degrees phase at low frequencies belonging thereto in a coordinate with frequency and phase in an exponential scale;
the second filter has a steep peak in a coordinate with frequency and magnitude in an exponential scale and has filtering characteristics of having 90 degrees phase at the rated frequency, 0 degrees phase at upper frequencies belonging to filtering cutoff frequencies, and 180 degrees phase at low frequencies belonging thereto in a coordinate with frequency and phase in an exponential scale; and
the third filter has a steep peak in a coordinate with frequency and magnitude in an exponential scale and has filtering characteristics of having −90 degrees phase at the rated frequency, 0 degrees phase at upper frequencies belonging to filtering cutoff frequencies, and −180 degrees phase at low frequencies belonging thereto in a coordinate with frequency and phase in an exponential scale.

2. The grid voltage phase detector of claim 1, wherein the signal on d axis is inputted to the first filter and the third filter; the signal on q axis is inputted to the second filter and the fourth filter; an output signal of the first filter and an output signal of the second filter which are combined are halved and provided as a filtered signal on d axis to the phase signal producer; an output signal of the third filter and an output signal of the fourth filter combined are halved and provided as a filtered signal on q axis to the phase signal producer.

3. The grid voltage phase detector of claim 1, wherein the first filter and the fourth filter individually have filtering characteristics of having a form of bilateral symmetry divided into equal right and left sides based around a rated frequency point in the coordinate with frequency and magnitude in an exponential scale;
the second filter has filtering characteristics of having points falling near to a straight sloped line at upper frequencies belonging to the filtering cutoff frequencies and having a certain magnitude at lower frequencies belonging thereto in the coordinate with frequency and magnitude in an exponential scale;
the third filter has filtering characteristics of having points falling near to a straight sloped line at lower frequencies belonging to the filtering cutoff frequencies and having a certain magnitude at upper frequencies belonging thereto in the coordinate with frequency and magnitude in an exponential scale.

4. The grid voltage phase detector of claim 1, wherein the first filter and the fourth filter individually have filtering characteristics in accordance with a Laplace's Formula 1 below in coordinates:

$$G_{PR\_C}(s) = \frac{k\omega_c s}{s^2 + k\omega_c s + \omega^2}; \quad \text{[Laplace's Formula 1]}$$

the second filter has filtering characteristics in accordance with a Laplace's Formula 2 in coordinates:

$$G_{PR\_SN}(s) = \frac{-k\omega_c \omega}{s^2 + k\omega_c s + \omega^2}; \quad \text{[Laplace's Formula 2]}$$

and
the third filter filtering characteristics in accordance with a Laplace's Formula 3 in coordinates:

$$G_{PR\_SP}(s) = \frac{k\omega_c\omega}{s^2 + k\omega_c s + \omega^2} \qquad \text{[Laplace's Formula 3]}$$

where in the above three Laplace's Formulas, ω is resonance frequency, k is a damping element, and $\omega_c$ is cutoff frequency.

5. The grid voltage phase detector of claim 1, wherein the PR filter is a digital filter for receiving a detected grid voltage signal as an input value and digitally transforming the input value into a digital value in accordance with predetermined transformation Formulas.

* * * * *